(12) United States Patent
Wang et al.

(10) Patent No.: US 12,469,759 B2
(45) Date of Patent: Nov. 11, 2025

(54) SEMICONDUCTOR PACKAGE

(71) Applicant: Taiwan Semiconductor Manufacturing Company, Ltd., Hsinchu (TW)

(72) Inventors: Po-Han Wang, Hsinchu (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 84 days.

(21) Appl. No.: 17/994,004

(22) Filed: Nov. 25, 2022

(65) Prior Publication Data

US 2023/0089795 A1   Mar. 23, 2023

Related U.S. Application Data

(62) Division of application No. 16/667,854, filed on Oct. 29, 2019, now Pat. No. 11,532,531.

(51) Int. Cl.
| | |
|---|---|
| H01L 23/31 | (2006.01) |
| H01L 23/498 | (2006.01) |
| H01L 25/16 | (2023.01) |
| H01L 21/48 | (2006.01) |
| H01L 21/56 | (2006.01) |
| H01L 23/00 | (2006.01) |

(52) U.S. Cl.
CPC .... *H01L 23/3128* (2013.01); *H01L 23/49816* (2013.01); *H01L 23/49822* (2013.01); *H01L 23/49838* (2013.01); *H01L 25/16* (2013.01); *H01L 21/4853* (2013.01); *H01L 21/4857* (2013.01); *H01L 21/568* (2013.01); *H01L 24/94* (2013.01)

(58) Field of Classification Search
CPC ........... H01L 23/3128; H01L 23/49816; H01L 23/49822; H01L 23/49838; H01L 25/043
See application file for complete search history.

(56) References Cited

U.S. PATENT DOCUMENTS

| | | | |
|---|---|---|---|
| 6,239,482 B1 * | 5/2001 | Fillion | H01L 23/13 257/700 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |

(Continued)

*Primary Examiner* — Phat X Cao
(74) *Attorney, Agent, or Firm* — JCIPRNET

(57) ABSTRACT

A semiconductor package including a semiconductor die, an encapsulant, an electrical connector, a conductive pad and an inter-dielectric layer is provided. The encapsulant encapsulates the semiconductor die. The electrical connector is disposed over the semiconductor die. The conductive pad contacts the electrical connector and is disposed between the semiconductor die and the electrical connector. The inter-dielectric layer is disposed over the semiconductor die, wherein the inter-dielectric layer comprises an opening, and a portion of the opening is occupied by the conductive pad and the electrical connector.

20 Claims, 15 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 9,837,359 B1* | 12/2017 | Chiu | H01L 21/4857 |
| 2016/0079191 A1* | 3/2016 | Chen | H01L 24/19 |
| | | | 257/773 |
| 2017/0141055 A1* | 5/2017 | Liu | H01L 21/6835 |
| 2017/0194226 A1* | 7/2017 | Chen | H01L 21/4846 |
| 2019/0244947 A1* | 8/2019 | Yu | H01L 24/92 |

* cited by examiner

SEMICONDUCTOR PACKAGE

CROSS-REFERENCE TO RELATED APPLICATION

This application is a divisional application of and claims the priority benefit of a prior application Ser. No. 16/667,854, filed on Oct. 29, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
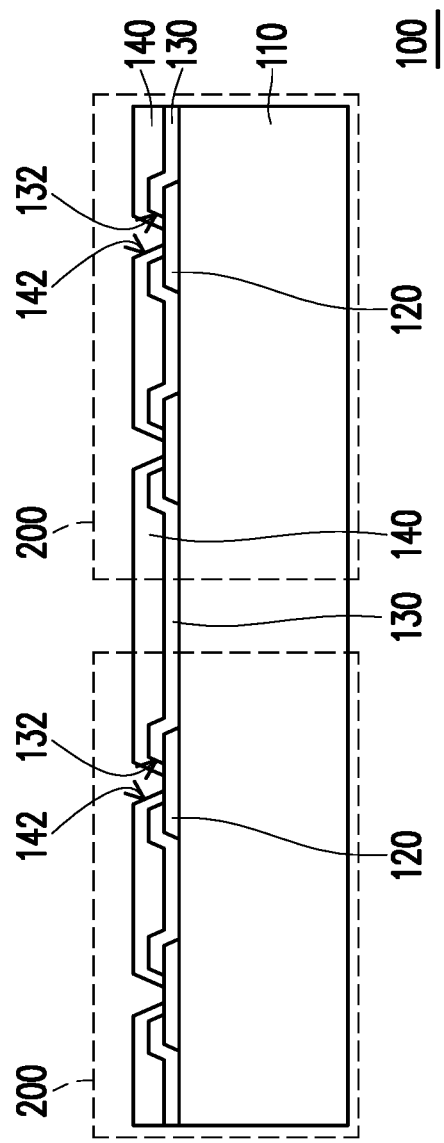
FIGS. 1 through 12 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11:
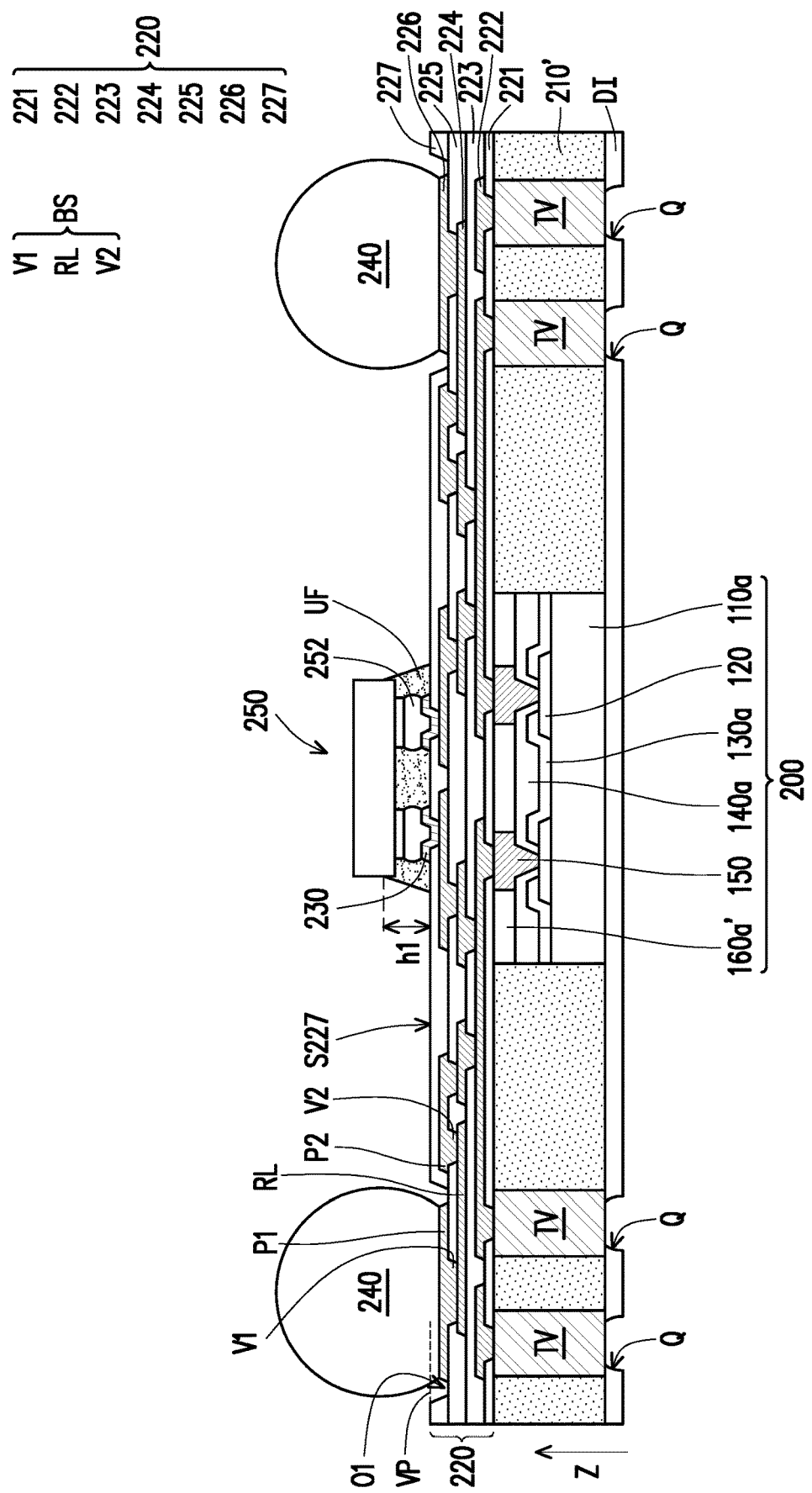
Figure 12:
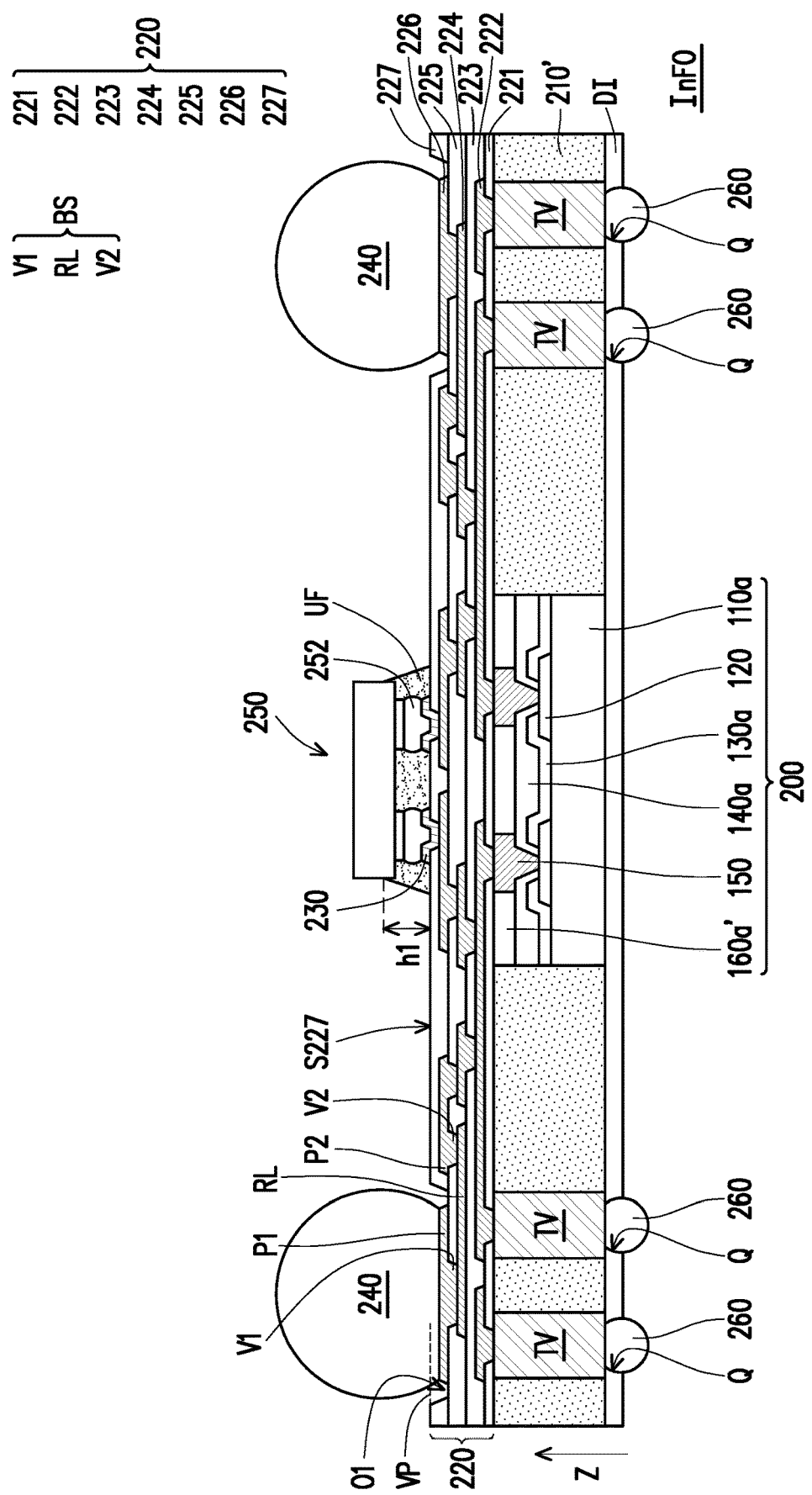
Figure 13:
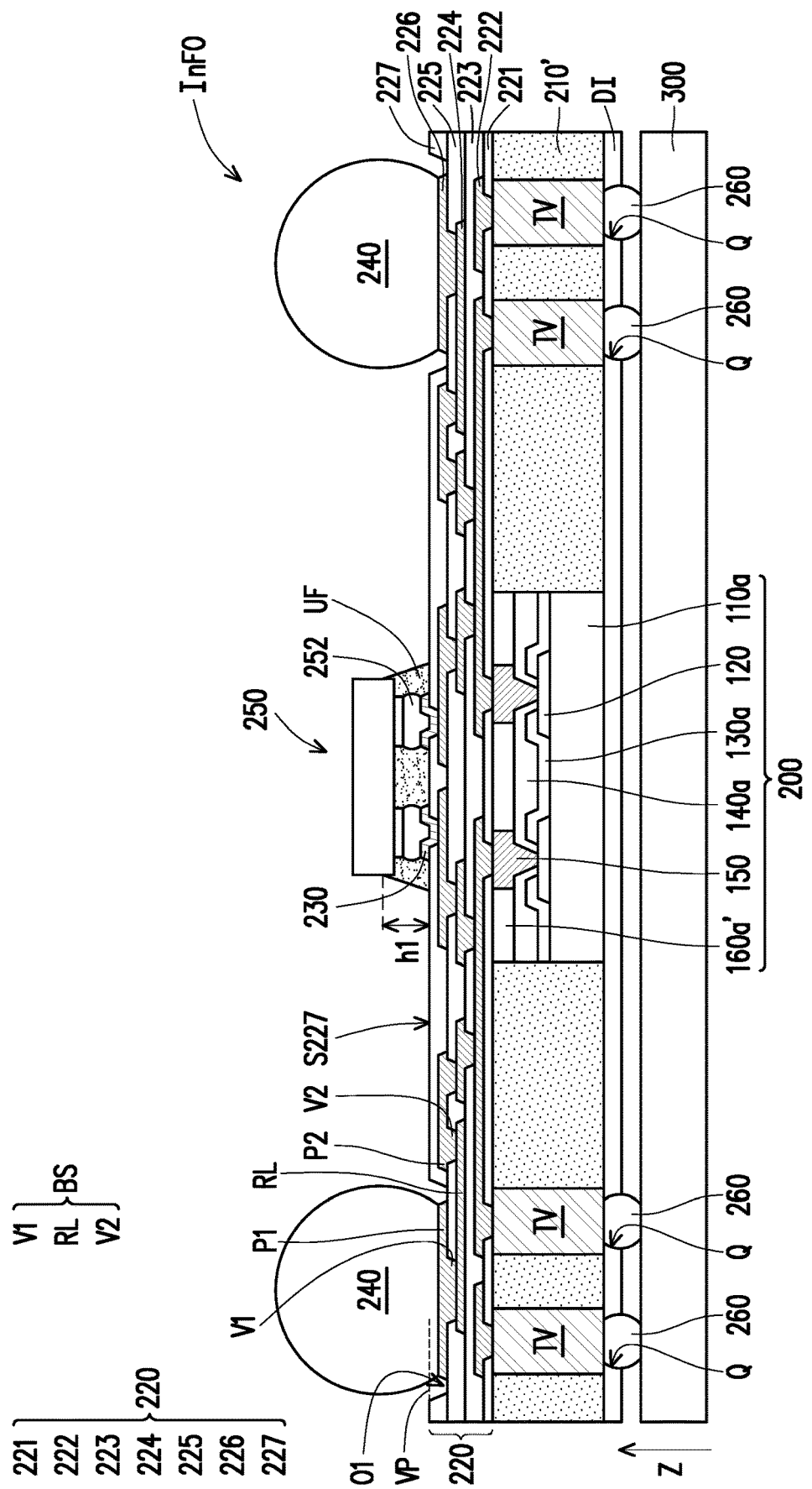
FIG. 13 is a cross-sectional view illustrating a package-on-package (POP) structure in accordance with some embodiments.
Figure 14:
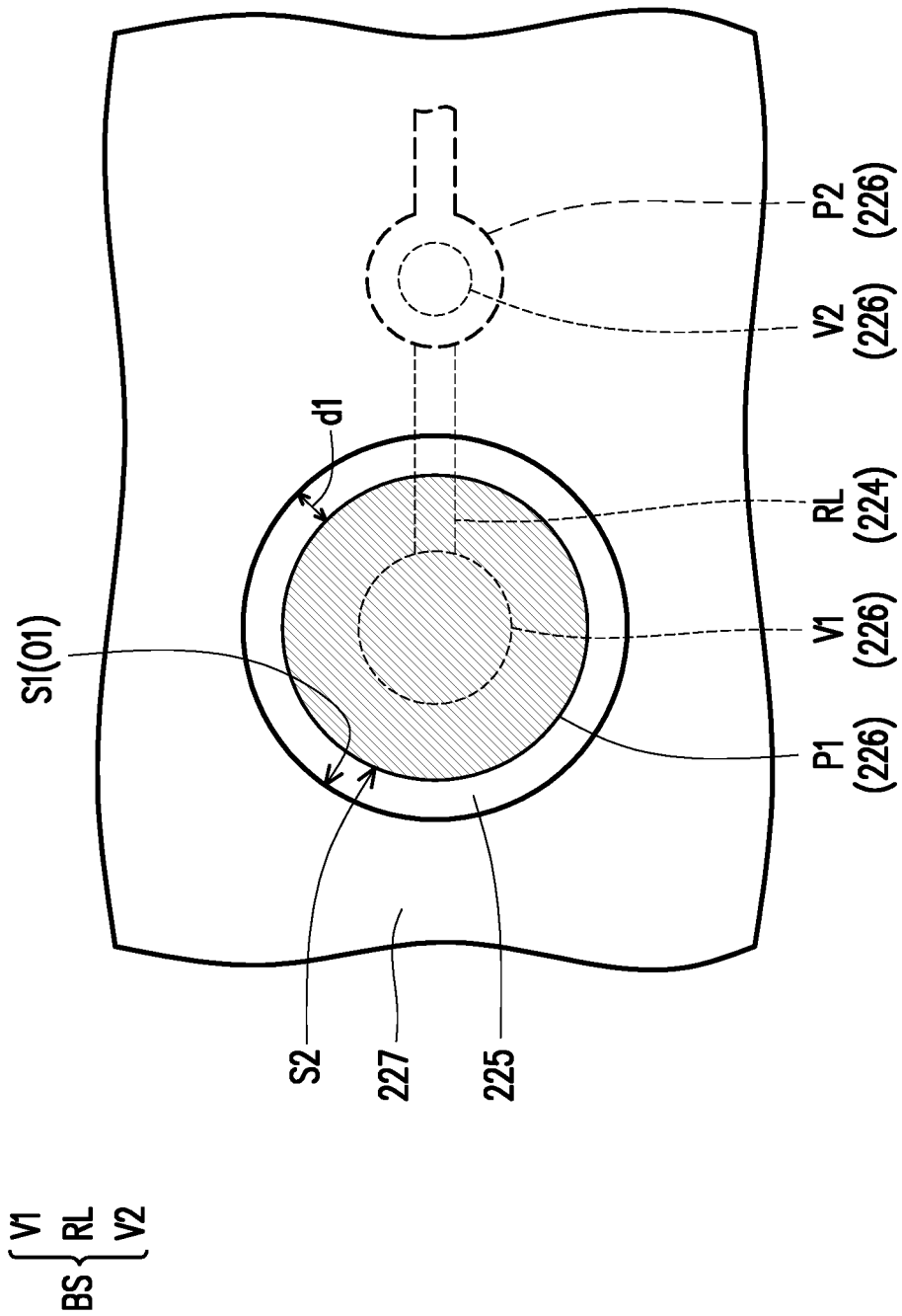
FIG. 14 is a top view illustrating one conductive pad P1, one bridge structure BS, part of the inter-dielectric layer 227 and part of the middle inter-dielectric layer 225 in accordance with some embodiments.

FIGS. 1 through 12 illustrate a process flow for fabricating an integrated fan-out package in accordance with some embodiments, FIG. 13 is a cross-sectional view illustrating a package-on-package (POP) structure in accordance with some embodiments, and FIG. 14 is a top view illustrating one conductive pad P1, one bridge structure BS, part of the inter-dielectric layer 227 and part of the middle inter-dielectric layer 225 in accordance with some embodiments.

Referring to FIG. 1, a wafer 100 including a plurality of semiconductor dies or integrated circuits 200 arranged in an array is provided. Before a wafer dicing process is performed on the wafer 100, the integrated circuits 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers. The passivation layer 130 and the post passivation layer 140 may be regarded as a composite passivation layer. Alternatively, the composite passivation layer may be replaced by a single passivation layer.

Figure 2:
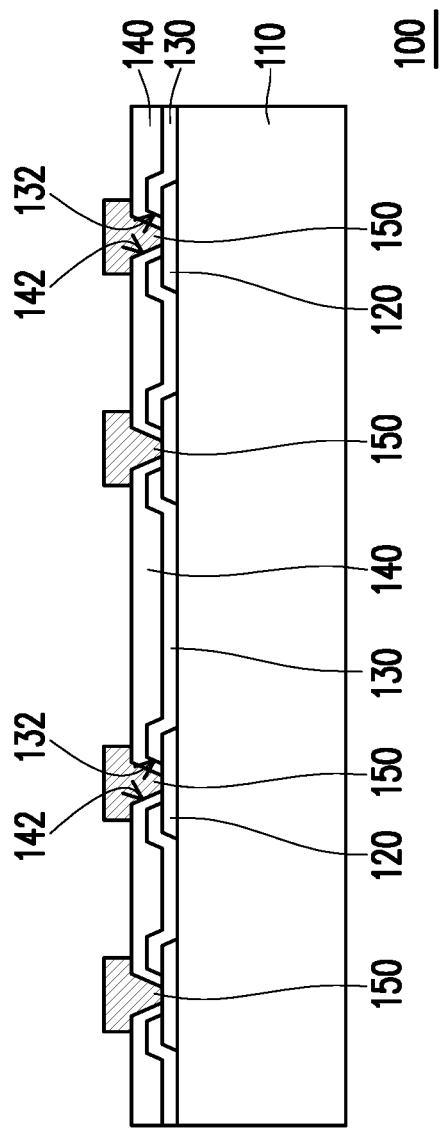

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, and the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example. In some embodiments, the conductive pillars 150 may be plated copper pillars.

Figure 3:
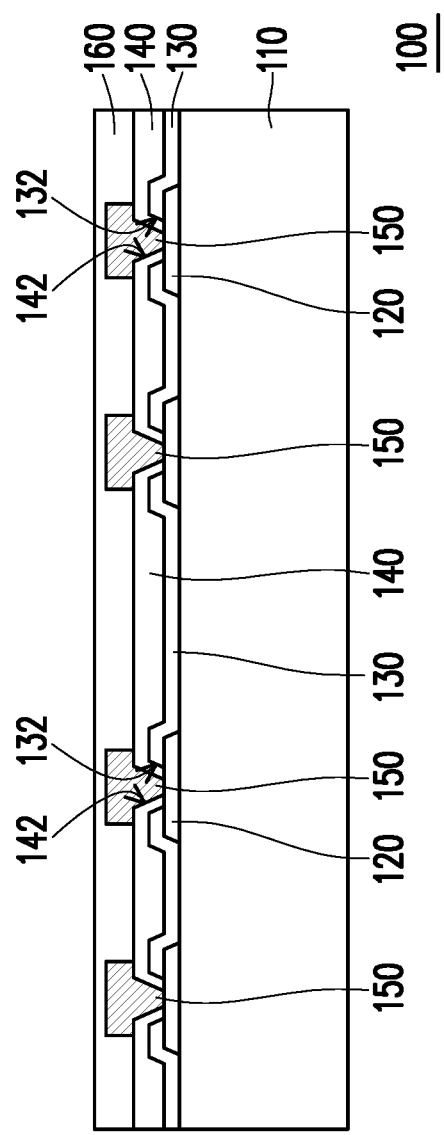

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
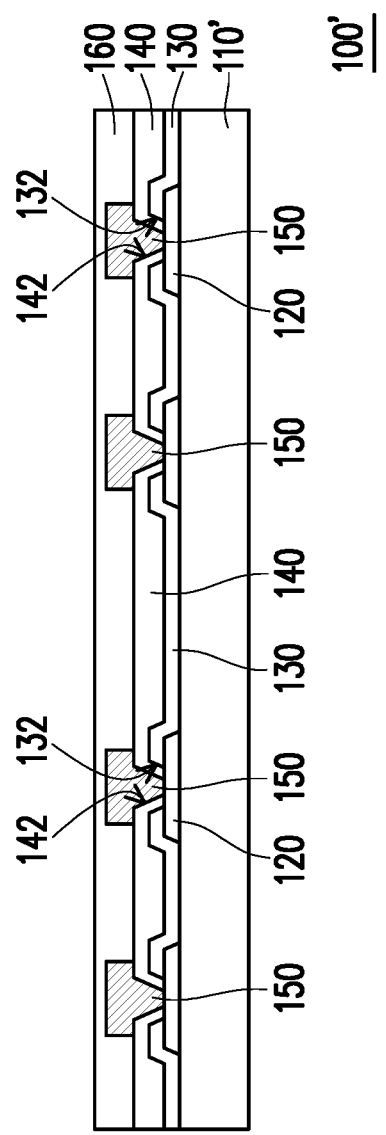

Referring to FIG. 3 and FIG. 4, a back-side grinding process is performed on the back surface of the wafer 100 after the protection layer 160 is formed. During the back-side grinding process, the semiconductor substrate 110 is ground by a grinding wheel such that a thinned wafer 100' including a thinned semiconductor substrate 110', the conductive pads 120 formed on the semiconductor substrate 110', the passivation layer 130, the post passivation layer 140, the conductive pillars 150 and the protection layer 160 is formed.

Figure 5:
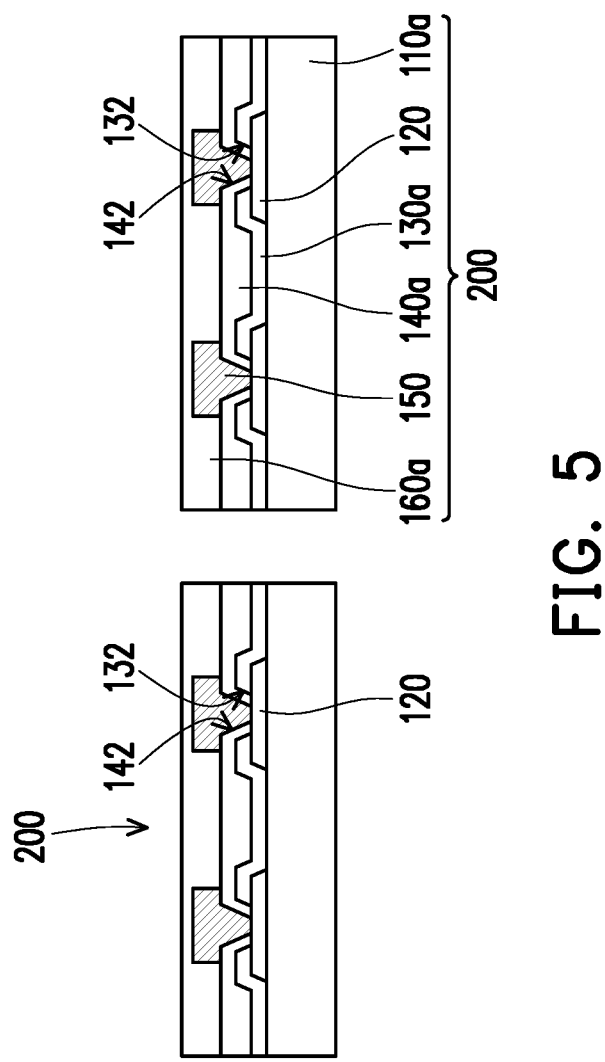

Referring to FIG. 5, after the back-side grinding process is performed, a wafer dicing process is performed on the thinned wafer 100' such that the semiconductor dies 200 in the thinned wafer 100' are singulated from one another. Each of the singulated semiconductor dies 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back-side grinding process and the wafer dicing process, the protection layer 160 may well protect the conductive pillars 150. In addition, the protection layer 160a may well protect the conductive pillars 150 of the semiconductor dies 200 from being damaged by subsequently performed processes, such as the picking-up and placing process of the semiconductor dies 200, the molding process, and so on.

Figure 6:
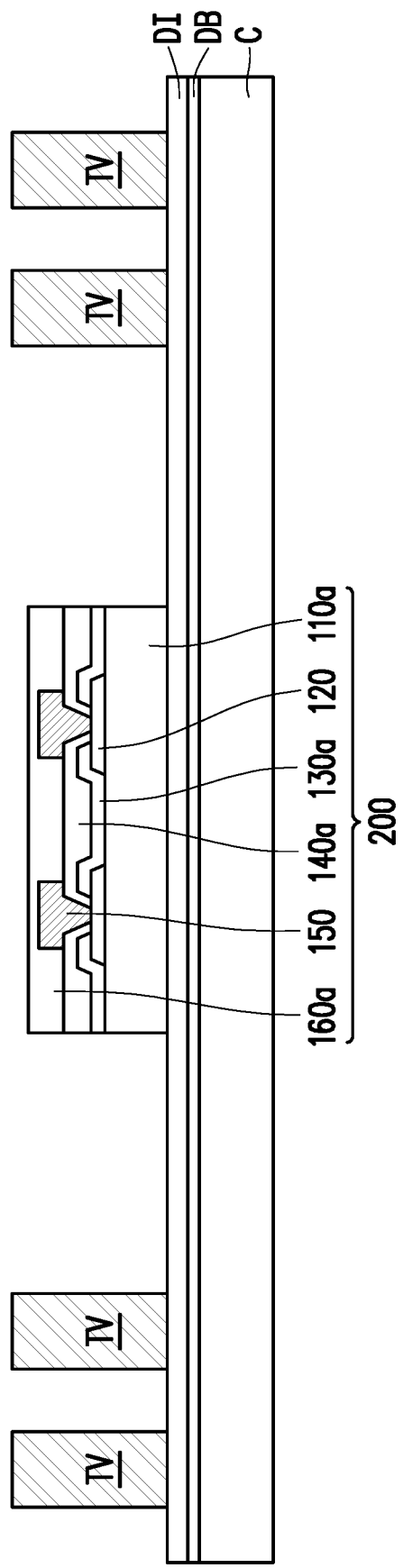

Referring to FIG. 6, after the semiconductor dies 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C is a glass substrate, for example. In some embodiments, the de-bonding layer DB is, for example, a light-to-heat conversion (LTHC) release layer formed on the glass substrate. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the materials of the de-bonding layer DB, the carrier C, and the dielectric layer DI are merely for illustration, and the disclosure is not limited thereto.

After the carrier C having the de-bonding layer DB and the dielectric layer DI formed thereon is provided, a plurality of conductive through vias TV are formed on the dielectric layer DI. In some embodiments, the conductive through vias TV are formed by photoresist coating, photolithography, plating, and photoresist stripping process. For example, the conductive through vias TV include copper posts or other suitable metal post.

As shown in FIG. 6, in some embodiments, one of the semiconductor dies 200 including the conductive pads 120, the conductive pillars 150, and a protection layer 160a formed thereon is picked and placed on the dielectric layer DI. The semiconductor die 200 is attached or adhered on the dielectric layer DI through a die attach film (DAF), an adhesion paste or the like. In some alternative embodiments, more than one of the semiconductor dies 200 are picked and placed on the dielectric layer DI, and the semiconductor dies 200 placed on the dielectric layer DI may be arranged in an array. When the semiconductor dies 200 placed on the dielectric layer DI are arranged in an array, the conductive through vias TV may be classified into groups. The number of the semiconductor dies 200 is corresponding to the number of the groups of the conductive through vias TV.

As shown in FIG. 6, the top surface of the protection layer 160a is lower than the top surfaces of the conductive through vias TV, and the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

As shown in FIG. 6, the semiconductor die 200 is picked and placed on the dielectric layer DI after the formation of the conductive through vias TV. However, the disclosure is not limited thereto. In some alternative embodiments, the semiconductor die 200 is picked and placed on the dielectric layer DI before the formation of the conductive through vias TV.

Figure 7:
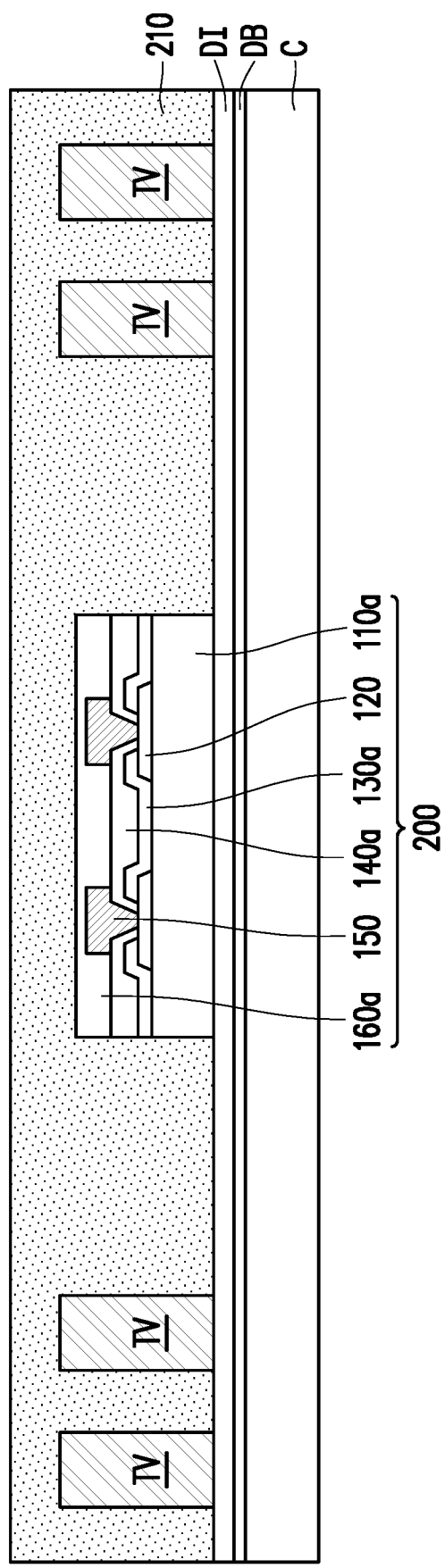

Referring to FIG. 7, an insulating material 210 is formed on the dielectric layer DI to cover the semiconductor die 200 and the conductive through vias TV. In some embodiments, the insulating material 210 may include a molding compound, a molding underfill, a resin, an epoxy, and/or the like. In some embodiments, the insulating material 210 may be formed by a molding process. The conductive pillars 150 and the protection layer 160a of the semiconductor die 200 are covered by the insulating material 210. In other words, the conductive pillars 150 and the protection layer 160a of the semiconductor die 200 are not revealed and are well protected by the insulating material 210.

Figure 8:
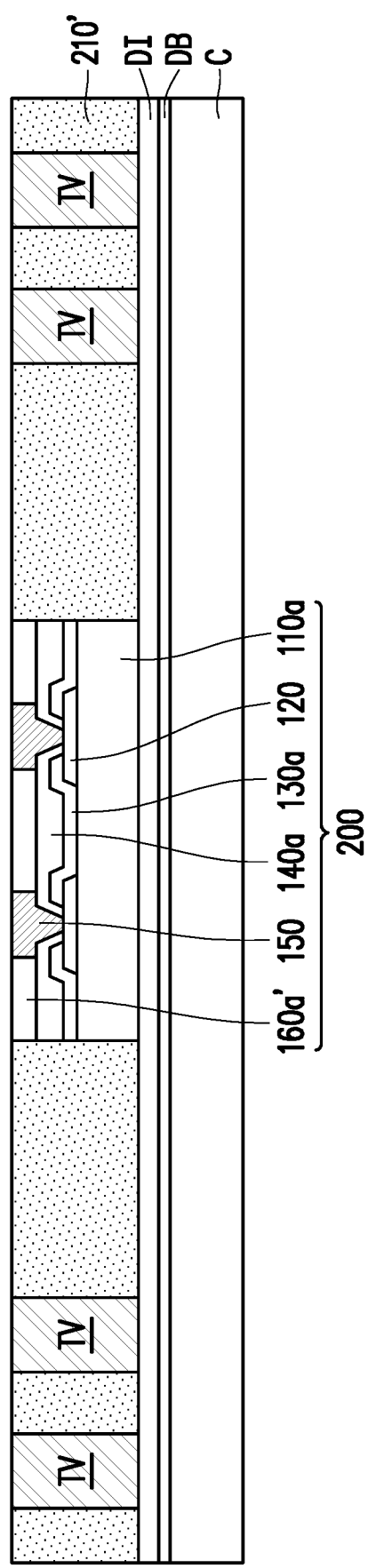

Referring to FIG. 8, the insulating material 210 is then ground until the top surfaces of the conductive pillars 150, and the top surfaces of the conductive through vias TV are exposed. In some embodiments, the insulating material 210 is ground by a mechanical grinding process and/or a chemical mechanical polishing (CMP) process. After the insulating material 210 is ground, an insulating encapsulant 210' is formed over the dielectric layer DI. During the grinding process of the insulating material 210, portions of the protection layer 160a are ground to form a protection layer 160a'. In some embodiments, during the grinding process of the insulating material 210 and the protection layer 160a, portions of the conductive through vias TV and portions of the conductive pillars 150 are ground also.

As shown in FIG. 8, the insulating encapsulant 210' encapsulates the sidewalls of the semiconductor die 200, and the insulating encapsulant 210' is penetrated by the conductive through vias TV. In other words, the semiconductor die 200 and the conductive through vias TV are embedded in the insulating encapsulant 210'. It is noted that the top surfaces of the conductive through vias TV, the top surface of the insulating encapsulant 210', and the top surfaces of the conductive pillars 150 are substantially coplanar with the top surface of the protection layer 160a'.

Figure 9:
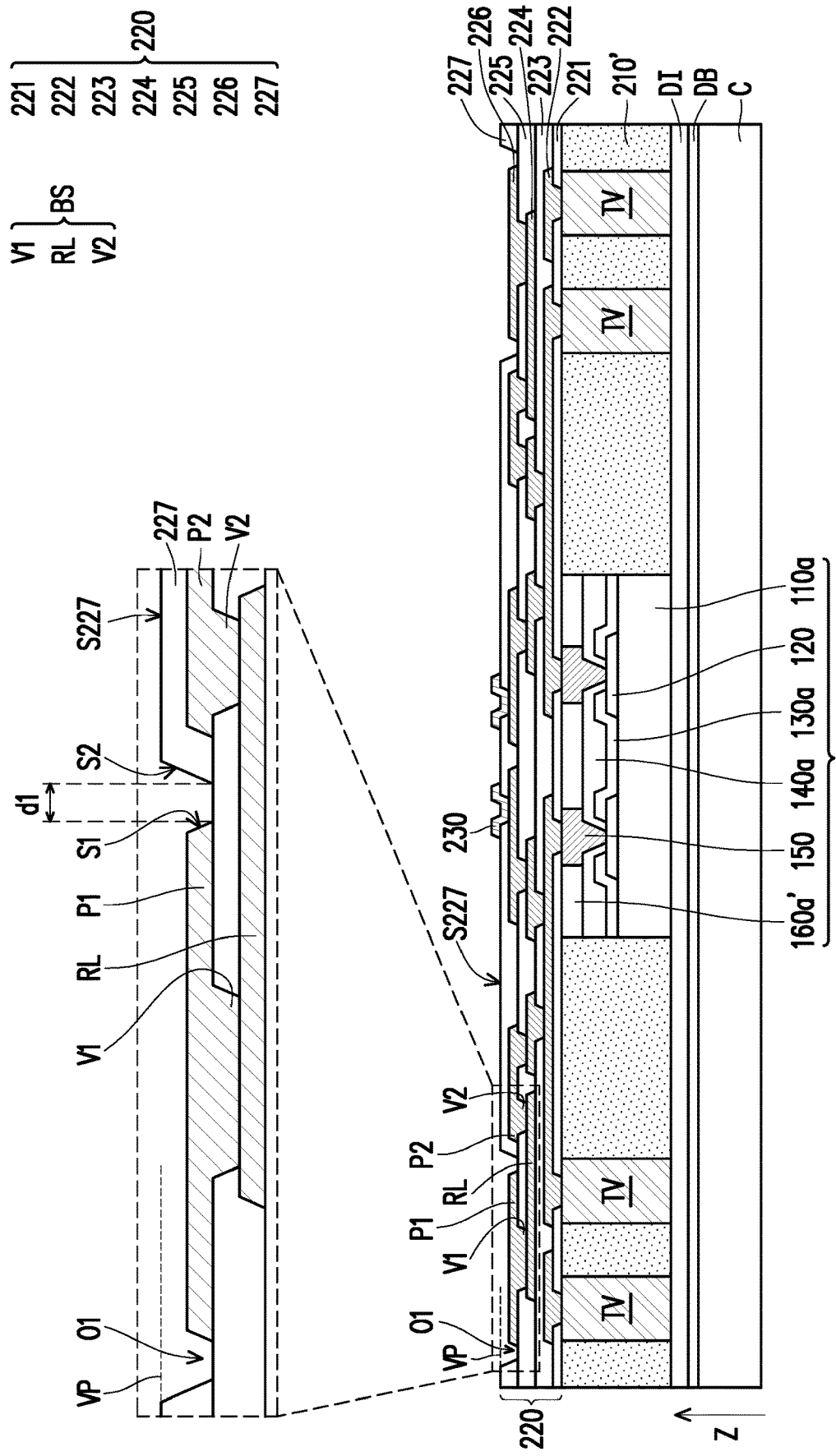

Referring to FIG. 9, after the insulating encapsulant 210' and the protection layer 160a' are formed, a redistribution circuit structure 220 electrically connected to the conductive pillars 150 of the semiconductor die 200 and the conductive through vias TV is formed on the top surfaces of the conductive through vias TV, the top surface of the insulating encapsulant 210', the top surfaces of the conductive pillars 150, and the top surface of the protection layer 160a'. The redistribution circuit structure 220 is fabricated to electrically connect with one or more connectors underneath. Here, the afore-said connectors may be the conductive pillars 150 of the semiconductor die 200 and/or the conductive through vias TV embedded in the insulating encapsulant 210'. The redistribution circuit structure 220 is described in accompany with FIG. 9 in detail.

Referring to FIG. 9, the redistribution circuit structure 220 includes a plurality of inter-dielectric layers 221, 223, 225 and 227 and a plurality of redistribution conductive layers 222, 224 and 226 stacked alternately, and the redistribution conductive layers 222, 224 and 226 are electrically connected to the conductive pillars 150 of the semiconductor die 200 and the conductive through vias TV embedded in the insulating encapsulant 210'. In some embodiments, the top surfaces of the conductive pillars 150 and the top surfaces of the conductive through vias TV are in contact with the redistribution circuit structure 220. In some embodiments, the top surfaces of the conductive pillars 150 and the top surfaces of the conductive through vias TV are partially covered by the inter-dielectric layer 221. In other words, the inter-dielectric layer 221 is regarded as a bottommost inter-dielectric layer of the redistribution circuit structure 220. In some embodiments, the redistribution conductive layer 222 is disposed on the inter-dielectric layer 221 and penetrates through the inter-dielectric layer 221 to be in contact with the top surfaces of the conductive pillars 150 and the top surfaces of the conductive through vias TV. In other words, the redistribution conductive layer 222 is regarded as a bottommost redistribution conductive layer of the redistribution circuit structure 220. In some embodiments, the top surface of the redistribution conductive layer 222 is partially covered by the inter-dielectric layer 223, and the redistribution conductive layer 224 is disposed on the inter-dielectric layer 223 and penetrates through the inter-dielectric layer 223 to be in contact with the top surface of the redistribution conductive layer 222. In other words, the inter-dielectric layer 223 is regarded as a middle inter-dielectric layer of the redistribution circuit structure 220, and the redistribution conductive layer 224 is regarded as a middle redistribution conductive layer of the redistribution circuit structure 220. In some embodiments, the top surface of the redistribution conductive layer 224 is partially covered by the inter-dielectric layer 225. In other words, the inter-dielectric layer 225 is also regarded as a middle inter-dielectric layer of the redistribution circuit structure 220. In some embodiments, the redistribution conductive layer 226 is disposed on the inter-dielectric layer 225 and penetrates through the inter-dielectric layer 225 to be in contact with the top surface of the redistribution conductive layer 224. In other words, the redistribution conductive layer 226 is regarded as a topmost redistribution conductive layer of the redistribution circuit structure 220. In some embodiments, the top surface of the redistribution conductive layer 226 is partially covered by the inter-dielectric layer 227. In other words, the inter-dielectric layer 227 is regarded as a topmost inter-dielectric layer of the redistribution circuit structure 220.

In some embodiments, each of the inter-dielectric layers 221, 223, 225 and 227 includes a photo-sensitive material such as polybenzoxazole (PBO), polyimide (PI), benzocyclobutene (BCB), a combination thereof or the like. In some embodiments, each of the redistribution conductive layers 222, 224 and 226 includes metal such as copper, nickel, titanium, a combination thereof or the like, and is formed by an electroplating process. In some embodiments, the redistribution conductive layers 222, 224 and 226 respectively includes a seed layer (not shown) and a metal layer formed thereon (not shown). The seed layer may be a metal seed layer such as a copper seed layer. In some embodiments, the seed layer includes a first seed sublayer and a second seed sublayer over the first seed sublayer, the first seed sublayer is, for example, a titanium layer, and the second seed sublayer is, for example, a copper layer. The metal layer may include copper or other suitable metals.

As shown in FIG. 9, after the redistribution circuit structure 220 is formed, a plurality of under-ball metallurgy (UBM) patterns 230 for mounting of a passive component 250 (described hereinafter) are then formed on the topmost redistribution conductive layer 226 and the topmost inter-dielectric layer 227 of the redistribution circuit structure 220. The UBM patterns 230 are electrically connected to the topmost redistribution conductive layer 226 of the redistribution circuit structure 220. In other words, the UBM patterns 230 are electrically connected to the conductive pillars 150 of the semiconductor die 200 and the conductive through vias TV through the redistribution circuit structure 220. It is noted that the number of the UBM patterns 230 is not limited in this disclosure.

Referring to FIG. 9 and FIG. 14, in some embodiment, the topmost redistribution conductive layer 226 includes a plurality of conductive pads P1 contacting the top surface of the middle inter-dielectric layer 225, and the topmost inter-dielectric layer 227 includes a plurality of openings O1. In some embodiments, the conductive pads P1 are exposed through the openings O1. That is to say, the openings O1 of the topmost inter-dielectric layer 227 are formed to expose the conductive pads P1. In some embodiments, the side surface S1 of each conductive pad P1 is surrounded by the sidewall S2 of the corresponding opening O1 defined by the topmost inter-dielectric layer 227, as shown in FIG. 9 and FIG. 14. That is to say, each conductive pad P1 is fully-disposed in the corresponding opening O1, and thus each conductive pad P1 occupies a portion of the corresponding opening O1. In other words, each conductive pad P1 is isolated by the topmost inter-dielectric layer 227. From the top view as shown in FIG. 14 and along the thickness direction Z in FIG. 9, the vertical projection of the conductive pad P1 falls within the span of the vertical projection of the opening O1. That is to say, the whole vertical projection of the conductive pad P1 overlaps the vertical projection of the opening O1. In addition, in some embodiments, a plane VP extending from the top surface S227 of the topmost inter-dielectric layer 227 is above the top surface of the conductive pad P1. Thus, the conductive pad P1 does not protrude out of the opening O1.

In some embodiments, the side surface S1 of the conductive pad P1 is spaced apart from the sidewall S2 of the opening O1 defined by the topmost inter-dielectric layer 227 with a minimum distance d1, as shown in FIG. 9 and FIG. 14. In certain embodiments, the minimum distance d1 between the side surface S1 of the conductive pad P1 and the sidewall S2 of the opening O1 ranges from about 3 μm to about 20 μm, thereby more flexibility is provided for the design of the layout of the topmost redistribution conductive layer 226, and the location precision of the conductive pad P1 may be ensured so as to avoid the side surface S1 of the conductive pad P1 from contacting the sidewall S2 of the opening O1.

In some embodiments, the sidewall S2 of the opening O1 defined by the topmost inter-dielectric layer 227 contacts the middle inter-dielectric layer 225. That is to say, each opening O1 is formed directly on the middle inter-dielectric layer 225. In some embodiments, a portion of the top surface of the middle inter-dielectric layer 225 is uncovered by the topmost inter-dielectric layer 227 and the conductive pads P1. As such, each opening O1 is formed to expose a portion of the top surface of the middle inter-dielectric layer 225. From the top view as shown in FIG. 14, the portion of the top surface of the middle inter-dielectric layer 225 exposed through the opening O1 and uncovered by the topmost inter-dielectric layer 227 and the conductive pad P1 is in a ring shape, and the width of the said ring shape is the minimum distance d1.

From the top view as shown in FIG. 14, the opening O1 and the conductive pad P1 each has a circular shape, and the opening O1 is substantially concentric with the conductive pad P1. However, the disclosure is not limited thereto. In some alternative embodiments, the center of circle of the conductive pad P1 is shifted from the center of circle of the opening O1 by a distance equal to or less than about 3 μm so that the conductive pad P1 and the opening O1 are misaligned (similar to eccentric circles from the top view). Furthermore, from the top view as shown in FIG. 14, the opening O1 and the conductive pad P1 each is formed to have a circular shape. However, the disclosure is not limited thereto. In some alternative embodiments, the opening O1 and the conductive pad P1 each may exhibit a polygonal shape, an oval shape or any suitable shape from the top view.

In some embodiments, the topmost redistribution conductive layer 226 further includes a plurality of conductive pads P2 contacting the top surface of the middle inter-dielectric layer 225 and covered by the topmost inter-dielectric layer 227. Since the conductive pads P2 is covered by the topmost inter-dielectric layer 227, the conductive pads P1 disposed in and exposed by the openings O1 of the topmost inter-dielectric layer 227 are spaced apart from the conductive pads P2 by the topmost inter-dielectric layer 227. That is to say, the conductive pads P1 do not physically contact the conductive pads P2. In some embodiments, the conductive pad P1 is spaced apart from the corresponding one of the conductive pads P2 by the opening O1 and the topmost inter-dielectric layer 227, as shown in FIG. 9 and FIG. 14. In some embodiments, the area ratio of the conductive pad P1 and the conductive pad P2 ranges from about 4 to about 625. With such configuration, more flexibility is provided for the design of the layout of the topmost redistribution conductive layer 226. From the top view as shown in FIG. 14, the conductive pad P1 and the conductive pad P2 each has a circular shape, and in certain embodiments, the diameter of the conductive pad P1 may range from about 100 μm to about 250 μm, the diameter of the conductive pad P2 may range from about 10 μm to about 50 μm. Furthermore, from the top view as shown in FIG. 14, the conductive pad P2 is formed to have a circular shape. However, the disclosure is not limited thereto. In some alternative embodiments, the conductive pad P2 may exhibit a polygonal shape or any suitable shape from the top view.

In some embodiments, the topmost redistribution conductive layer 226 further includes a plurality of conductive vias V1 and a plurality of conductive vias V2 inlaid within the middle inter-dielectric layer 225. In some embodiments, the conductive pad P1 is disposed right above the corresponding one of the conductive vias V1, and the conductive pad P2 is disposed right above the corresponding one of the conductive vias V2. In some embodiments, the conductive pad P1 contacts the corresponding one of the conductive vias V1, and the conductive pad P2 contacts the corresponding one of the conductive vias V2. From the top view as shown in FIG. 14 and along the thickness direction Z in FIG. 9, the vertical projection of the conductive via V1 falls within the span of the vertical projection of the conductive pad P1, and the vertical projection of the conductive via V2 falls within the span of the vertical projection of the conductive pad P2. That is to say, the whole vertical projection of the conductive via V1 overlaps the vertical projection of the conductive pad P1, and the whole vertical projection of the conductive via V2 overlaps the vertical projection of the conductive pad P2. It is understood that the cross-sectional shape of each conductive via V1 or each conductive via V2 is not limited to be a round shape as shown in FIG. 14 but may be tetragonal shape, hexagonal shape, octagonal shape or any suitable polygonal shapes.

In some embodiments, the middle redistribution conductive layer 224 includes a plurality of routing lines RL inlaid within the middle inter-dielectric layer 225 and contacting the top surface of the middle inter-dielectric layer 223. In some embodiments, each of the routing lines RL contacts the conductive via V1 and the conductive via V2. In detail, the conductive via V1 contacting the conductive pad P1 and the conductive via V2 contacting the conductive pad P2 that is spaced apart from the said conductive pad P1 by the opening O1 and the topmost inter-dielectric layer 227 are in contact with the same routing line RL, as shown in FIG. 14. In other words, the conductive pad P1 is electrically connected to the corresponding conductive pad P2 through one conductive via V1, one routing line RL and one conductive via V2. Due to such configuration, the conductive via V1, the routing line RL and the conductive via V2 for electrically connecting the conductive pad P1 to the corresponding conductive pad P2 may serve as a bridge structure BS between the conductive pad P1 and the conductive pad P2. In some embodiments, each bridge structure BS is inlaid within the middle inter-dielectric layer 225, and underlies the conductive pads P1 and the conductive pads P2. In some embodiments, the length of the routing line RL ranges from about 50 µm to about 150 µm. With such configuration, more flexibility is provided for the design of the layout of the middle redistribution conductive layer 224. As shown in FIG. 14, the routing line RL has a substantially constant line width. However, the disclosure is not limited thereto. In some alternative embodiments, the routing line RL may have multiple varied line widths from the top view.

In some embodiments, the conductive pads P2 are electrically connected to the conductive pillars 150 of the semiconductor die 200 and the conductive through vias TV. As such, each conductive pad P1 is electrically connected to the conductive pillars 150 of the semiconductor die 200 and the conductive through vias TV through the corresponding bridge structure BS and the corresponding conductive pad P2.

Figure 10:
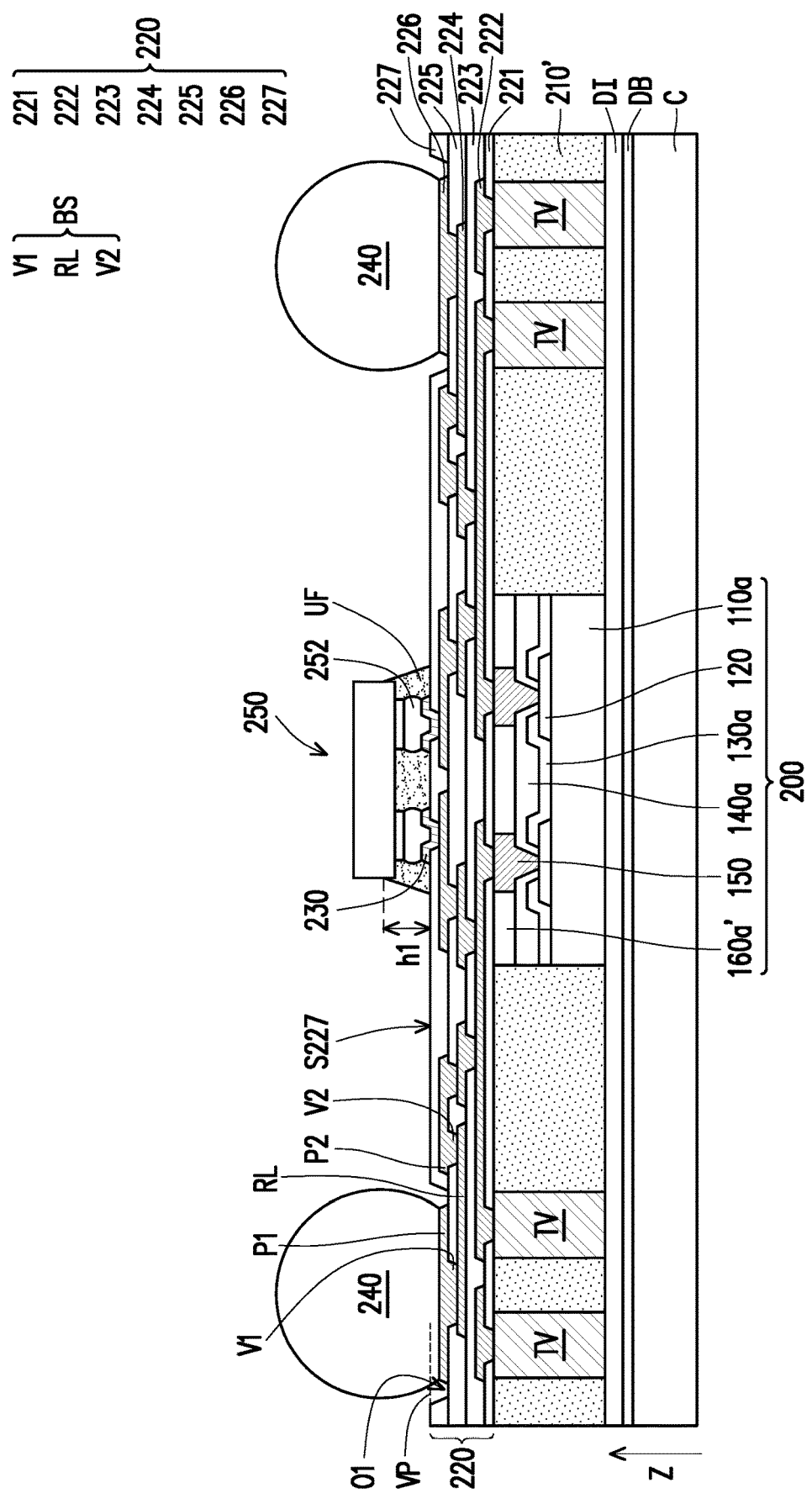

Referring to FIG. 10, after the UBM patterns 230 are formed, a plurality of conductive balls 240 are placed on the conductive pads P1, and a passive component 250 is mounted on the UBM patterns 230. In some embodiments, each conductive ball 240 is disposed right above the corresponding conductive pad P1. As mentioned above, the whole vertical projection of the conductive via V1 overlaps the vertical projection of the conductive pad P1, and thus from the top view and along the thickness direction Z in FIG. 10, the whole vertical projection of the conductive via V1 overlaps the vertical projection of the conductive ball 240. That is to say, each conductive ball 240 is disposed right above the corresponding conductive via V1. In addition, the top surface of the conductive pad P1 is below the plane VP extending from the top surface S227 of the topmost inter-dielectric layer 227 as mentioned above, thereby a portion of the opening O1 is occupied by both of the conductive pad P1 and the conductive ball 240 placed on the said conductive pad P1.

In some embodiments, the conductive balls 240 are, for example, solder balls, ball grid array (BGA) balls, or C4 bumps. In the case that the conductive balls 240 are BGA balls, the diameter of the conductive balls 240 ranges from about 150 µm to about 250 µm. In some embodiments, the conductive balls 240 are made of a conductive material with low resistivity, such as Sn, Pb, Ag, Cu, Ni, Bi, or an alloy thereof. In some embodiments, the conductive balls 240 may be disposed on the conductive pads P1 by a ball placement process and/or a reflow process. In some embodiments, the conductive balls 240 are joined with the conductive pads P1 of the redistribution circuit structure 220 through a solder flux (not shown). It is noted that since the conductive pads P1 on which the conductive balls 240 are placed are respectively disposed in the openings O1 and then spaced apart from the conductive pads P2 as mentioned above, there is no path for the solder flux to penetrate into any interface of the redistribution circuit structure 220, thereby avoiding the interface delamination issue of the redistribution circuit structure 220. Accordingly, the reliability of the redistribution circuit structure 220 is enhanced. In addition, by separating the side surface S1 of the conductive pad P1 and the sidewall S2 of the opening O1 with the minimum distance d1 of about 3 µm to about 20 µm as mentioned above, the interface delamination issue of the redistribution circuit structure 220 is eliminated while more flexibility is provided for the design of the layout of the topmost redistribution conductive layer 226.

As mentioned above, the conductive balls 240 are directly placed on the conductive pads P1 of the redistribution circuit structure 220, and thus the conductive balls 240 and the conductive pads P1 are in contact with each other without an UBM layer therebetween.

In some embodiments, the passive component 250 includes conductive terminals 252, and the passive component 250 is mounted on the UBM patterns 230 through the conductive terminals 252. Hence, the conductive terminals 252 may serve as the connectors for connecting the passive component 250 with the semiconductor die 200, and the UBM patterns 230 may serve as the connection pads for connecting to the passive component 250. In other words, the passive component 250 is electrically connected to the conductive pillars 150 of the semiconductor die 200 and the conductive through vias TV through the UBM patterns 230 and the redistribution circuit structure 220. In some embodiments, the conductive terminals 252 are, for example, micro-bumps. In some embodiments, the conductive terminals 252 are, for example, solder bumps. In some embodiments, the conductive terminals 252 are made of a conductive material with low resistivity, such as Sn, Pb, Ag, Cu, Ni, Bi, or an alloy thereof. In some embodiments, a solder flux (not shown) may be applied onto the conductive terminals 252 for better adhesion. In some embodiments, the passive component 250 may be mounted on the UBM patterns 230 through a soldering process, a reflowing process, or other suitable processes. In some embodiments, the passive component 250 may include capacitors, resistors, inductors, fuses, or the like. In some embodiments, the height of the conductive balls 240 is greater than the height of the passive component 250, for example. Only one passive component 250 is present in FIG. 10, but the number of the passive component 250 to be mounted on the redistribution circuit structure 220 is not particularly limited to the embodiments and can be varied based on design requirements. The passive component 250 present in FIG. 10 is bonded to two UBM patterns 230, but the number of the UBM patterns 230 to be bonded to the passive component 250 is not particularly limited to the embodiments and can be varied based on design requirements.

As shown in FIG. 10, after the passive component 250 is mounted on the UBM patterns 230, an underfill layer UF is formed between the passive component 250 and the topmost inter-dielectric layer 227 of the redistribution circuit structure 220, and encapsulates the UBM patterns 230, the conductive terminals 252 and the bottom surface of the passive component 250 to enhance the reliability. In certain embodiments, a distance h1 between the top surface S227 of the topmost inter-dielectric layer 227 and the topmost point of the underfill layer UF ranges from about 20 µm to about 100 µm.

Referring to FIG. 10 and FIG. 11, after the conductive balls 240 are placed on the conductive pads P1, and the passive component 250 is mounted on the UBM patterns 230, the dielectric layer DI formed on the bottom surface of the insulating encapsulant 210' is de-bonded from the de-bonding layer DB such that the dielectric layer DI is separated from the carrier C. In some embodiments, the de-bonding layer DB (e.g., the LTHC release layer) may be irradiated by an UV laser such that the dielectric layer DI is peeled from the carrier C.

As shown in FIG. 11, the dielectric layer DI is then patterned such that a plurality of contact openings Q are formed to expose the bottom surfaces of the conductive through vias TV. The number and position of the contact openings Q are corresponding to the number of the conductive through vias TV. In some embodiments, the contact openings Q of the dielectric layer DI are formed by a laser drilling process or other suitable patterning processes.

Referring to FIG. 12, after the contact openings Q are formed in the dielectric layer DI, a plurality of conductive balls 260 are placed on the bottom surfaces of the conductive through vias TV that are exposed by the contact openings Q. And, the conductive balls 260 are, for example, reflowed to bond with the bottom surfaces of the conductive through vias TV. As shown in FIG. 12, after the conductive balls 240 and the conductive balls 260 are formed, an integrated fan-out package InFO having dual-side terminal design (i.e. the conductive balls 240 and 260) is accomplished. In some alternative embodiments, an integrated fan-out package array may be formed, and the integrated fan-out package array is diced to form a plurality of integrated fan-out packages. In some alternative embodiments, the dicing process or singulation process typically involves dicing with a rotating blade or a laser beam. In other words, the dicing or singulation process is, for example, a laser cutting process, a mechanical cutting process, or other suitable processes. In some embodiments, the conductive balls 240 may serve as external terminals of the integrated fan-out package InFO. That is to say, the conductive balls 240 may serve as the connectors for connecting to an external device, and the conductive pads P1 on which the conductive balls 240 are placed may serve as the connection pads for connecting to an external device.

Referring to FIG. 13, another package 300 is then provided. In some embodiments, the package 300 is, for example, a memory device or other suitable semiconductor devices. The package 300 is stacked over and is electrically connected to the integrated fan-out package InFO through the conductive balls 260 such that a package-on-package (POP) structure is fabricated. In the above-mentioned embodiments, since the conductive balls 240 of the integrated fan-out package InFO are directly connected to the conductive pads P1 included in the topmost redistribution conductive layer 226 of the redistribution circuit structure 220, compared with the conventional POP structure in which the conductive balls are connected to the under-ball metallurgy patterns on the topmost inter-dielectric layer, the thickness of the POP structure illustrated in FIG. 13 is reduced.

In the above-mentioned embodiments, each conductive pad P1 of the integrated fan-out package InFO has a substantially flat surface. However, the disclosure is not limited thereto. In some alternative embodiments, each conductive pad P1 may have a concave surface. The details will be described below with reference to FIG. 15.

Figure 15:
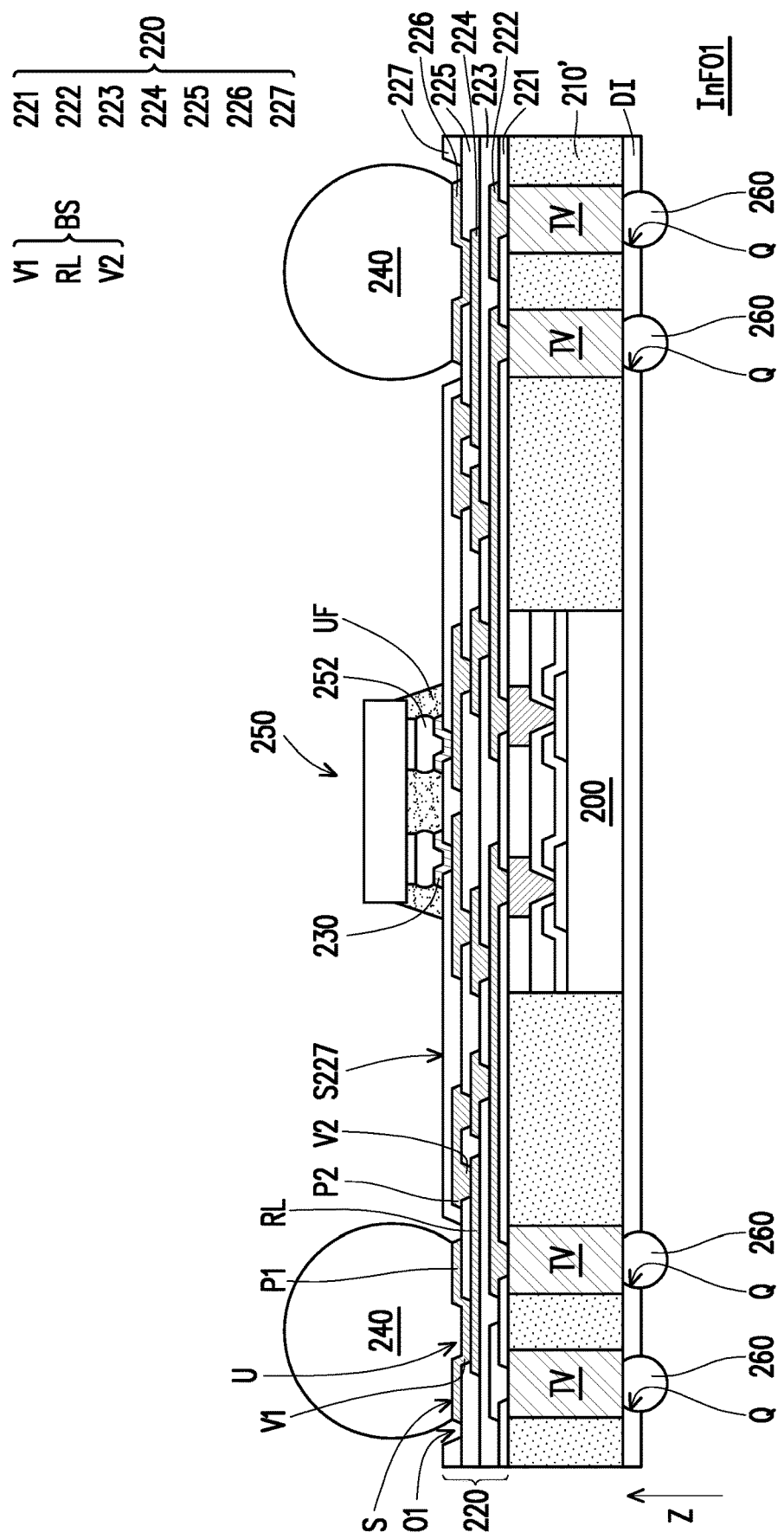
FIG. 15 is a cross-sectional view illustrating an integrated fan-out package in accordance with some embodiments.

FIG. 15 is a cross-sectional view illustrating an integrated fan-out package in accordance with some embodiments. The integrated fan-out package InFO1 shown in FIG. 15 is similar to the integrated fan-out package InFO shown in FIG. 12, hence the same reference numerals are used to refer to the same or liked parts, and its detailed description will be omitted herein.

Referring to FIG. 15, in the integrated fan-out package InFO1, each conductive pad P1 has a concave portion U. In other words, the top surface S of each conductive pad P1 has a concave contour. Due to such configuration, the conductive balls 240 can be more strongly fixed by the conductive pads P1. Accordingly, the integrated fan-out package InFO1 has a good reliability.

In the above-mentioned embodiments, the conductive pads P1 and the UBM patterns 230 which contact the connectors (e.g., the conductive balls 240 and the conductive terminals 252) are disposed in different layers. That is, the UBM patterns 230 are located in a different layer from the conductive pads P1. However, the disclosure is not limited thereto. In some alternative embodiments, the connection pads contacting the conductive terminals 252 may be located in the same layer as the connection pads contacting the conductive pads P1. The details will be described below with reference to FIG. 16 and FIG. 17.

Figure 16:
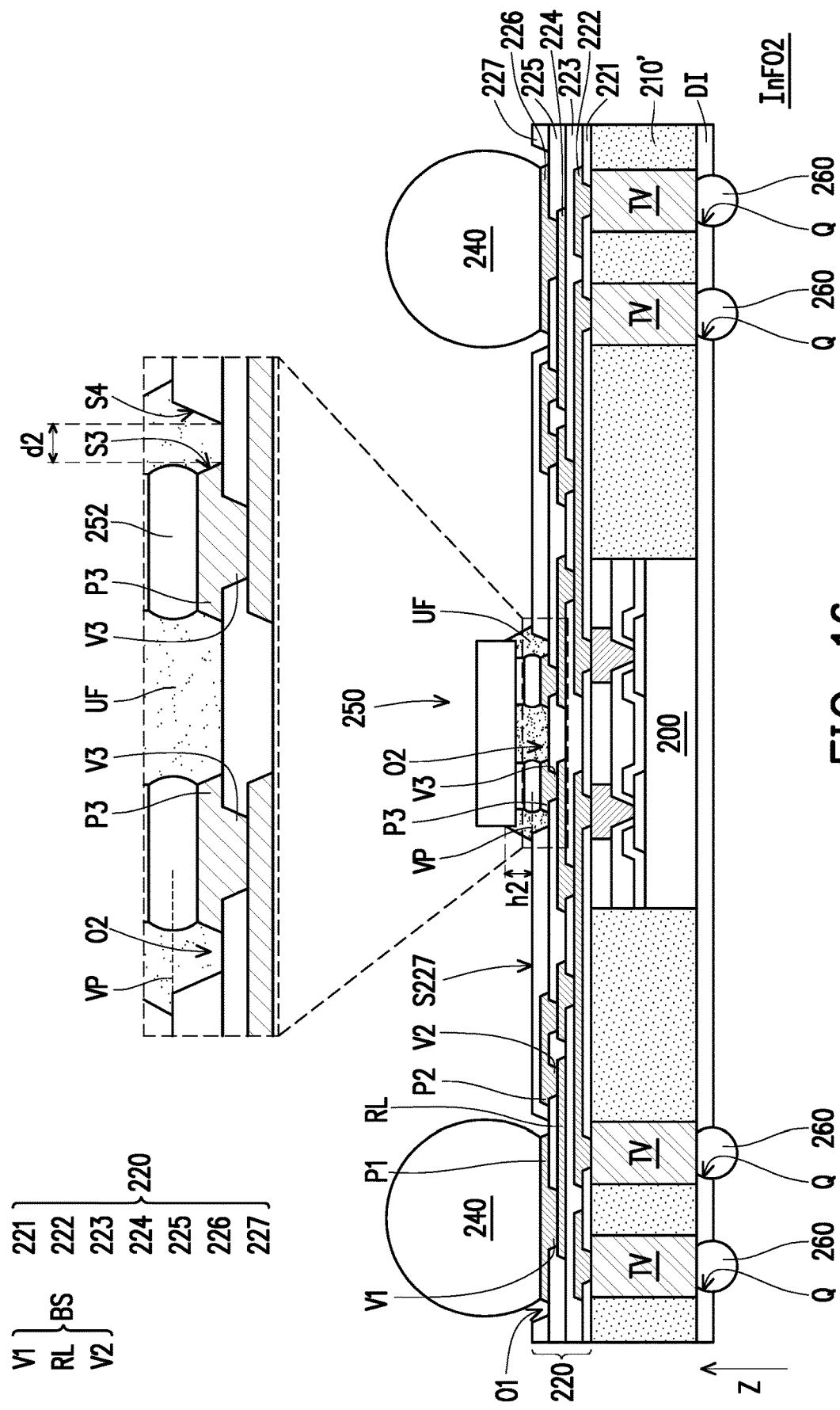
FIG. 16 is a cross-sectional view illustrating an integrated fan-out package in accordance with some embodiments.
Figure 17:
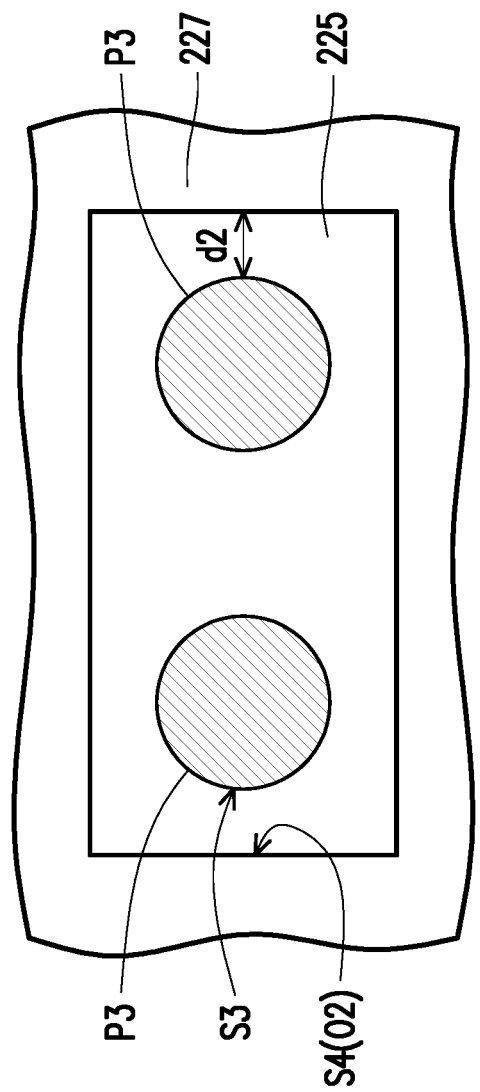
FIG. 17 is a top view illustrating the conductive pads P3, part of the inter-dielectric layer 227 and part of the middle inter-dielectric layer 225 in accordance with some embodiments.

FIG. 16 is a cross-sectional view illustrating an integrated fan-out package in accordance with some embodiments. FIG. 17 is a top view illustrating the conductive pads P3, part of the inter-dielectric layer 227 and part of the middle inter-dielectric layer 225 in accordance with some embodiments. The integrated fan-out package InFO2 shown in FIG. 16 is similar to the integrated fan-out package InFO shown in FIG. 12, hence the same reference numerals are used to refer to the same or liked parts, and its detailed description will be omitted herein.

Referring to FIG. 16, in the integrated fan-out package InFO2, the topmost redistribution conductive layer 226 further includes a plurality of conductive pads P3 contacting the top surface of the middle inter-dielectric layer 225, and the topmost inter-dielectric layer 227 further includes an opening O2. In some embodiments, the conductive pads P3 are exposed through the opening O2. That is to say, the opening O2 of the topmost inter-dielectric layer 227 is formed to expose the conductive pads P3. In some embodiments, the side surface S3 of each conductive pad P3 is surrounded by the sidewall S4 of the opening O2 defined by the topmost inter-dielectric layer 227, as shown in FIG. 16 and FIG. 17. That is to say, each conductive pad P3 is fully-disposed in the opening O2, and thus each conductive pad P3 occupies a portion of the opening O2. In other words, each conductive pad P3 is isolated by the topmost inter-dielectric layer 227. From the top view as shown in FIG. 17 and along the thickness direction Z in FIG. 16, the vertical projection of each conductive pad P3 falls within the span of the vertical projection of the opening O2. That is to say, the whole vertical projection of each conductive pad P3 overlaps the vertical projection of the opening O2. In addition, in some embodiments, the plane VP extending from the top surface S227 of the topmost inter-dielectric layer 227 is above the top surface of each conductive pad P3. Thus, the conductive pads P3 do not protrude out of the opening O2.

In some embodiments, the side surface S3 of the conductive pad P3 is spaced apart from the sidewall S4 of the opening O2 defined by the topmost inter-dielectric layer 227 with a minimum distance d2, as shown in FIG. 16 and FIG. 17. In certain embodiments, the minimum distance d2 between the side surface S3 of the conductive pad P3 and the sidewall S4 of the opening O2 ranges from about 3 μm to about 100 μm, thereby more flexibility is provided for the design of the layout of the topmost redistribution conductive layer 226, and the location precision of the conductive pad P3 may be ensured so as to avoid the side surface S3 of the conductive pad P3 from contacting the sidewall S4 of the opening O4. In addition, in some embodiments, the sidewall S4 of the opening O2 defined by the topmost inter-dielectric layer 227 contacts the middle inter-dielectric layer 225. That is to say, the opening O2 is formed directly on the middle inter-dielectric layer 225. In some embodiments, a portion of the top surface of the middle inter-dielectric layer 225 is uncovered by the topmost inter-dielectric layer 227 and the conductive pads P3. As such, the opening O2 is formed to expose a portion of the top surface of the middle inter-dielectric layer 225.

From the top view as shown in FIG. 17, each conductive pad P3 is formed to have a circular shape. However, the disclosure is not limited thereto. In some alternative embodiments, each conductive pad P3 may exhibit a polygonal shape or any suitable shape from the top view. In addition, from the top view as shown in FIG. 17, the opening O2 is formed to have a tetragonal shape. However, the disclosure is not limited thereto. In some alternative embodiments, the opening O2 may exhibit a circular shape, hexagonal shape, octagonal shape or any suitable polygonal shapes from the top view.

In some embodiments, the topmost redistribution conductive layer 226 further includes a plurality of conductive vias V3 inlaid within the middle inter-dielectric layer 225. In some embodiments, each conductive via V3 is electrically connected to the middle redistribution conductive layer 224 and the corresponding one of the conductive pads P3. It is understood that the cross-sectional shape of each conductive via V3 is not limited to be a round shape as shown in the top view of FIG. 17 but may be tetragonal shape, hexagonal shape, octagonal shape or any suitable polygonal shapes.

In some embodiments, in the integrated fan-out package InFO2, the passive component 250 is mounted on the conductive pads P3 through the conductive terminals 252. That is to say, the conductive pads P3 exposed by the opening O2 serve as the connection pads for connecting to the passive component 250. Referring to FIG. 16 and FIG. 12, it is noted that the difference between the integrated fan-out package InFO2 and the integrated fan-out package InFO1 lies in that the passive component 250 of the integrated fan-out package InFO2 is electrically connected to the semiconductor die 200 and the conductive through vias TV through the redistribution circuit structure 220, while the passive component 250 of the integrated fan-out package InFO1 is electrically connected to the semiconductor die 200 and the conductive through vias TV through the UBM patterns 230 and the redistribution circuit structure 220. In addition, the top surface of each conductive pad P3 is below the plane VP extending from the top surface S227 of the topmost inter-dielectric layer 227 as mentioned above, thereby a portion of the opening O2 is occupied by both of the conductive pads P3 and the conductive terminals 252 bonded to the said conductive pads P3.

In some embodiments, in the integrated fan-out package InFO2, the underfill layer UF encapsulates the conductive pads P3, the conductive terminals 252 and the bottom surface of the passive component 250 and fills the opening O2. It is noted that in the integrated fan-out package InFO2, the passive component 250 is mounted on the conductive pads P3 included in the topmost redistribution conductive layer 226 and the underfill layer UF fills the opening O2 of the topmost inter-dielectric layer 227, and thus compared with the distance h1 of the integrated fan-out package InFO1, a distance h2 between the top surface S227 of the topmost inter-dielectric layer 227 and the topmost point of the underfill layer UF of the integrated fan-out package InFO2 is reduced. In certain embodiments, the distance h2 of the integrated fan-out package InFO2 ranges from about 50 µm to about 100 µm. The passive component 250 present in FIG. 16 is bonded to two conductive pads P3, but the number of the conductive pads P3 to be bonded to the passive component 250 is not particularly limited to the embodiments and can be varied based on design requirements.

In the above-mentioned embodiments shown in FIG. 16, since the conductive pads P1 on which the conductive balls 240 are placed are respectively disposed in the openings O1, and the conductive pads P3 to which the conductive terminals 252 are bonded are disposed in the opening O2, there is no path for the solder flux to penetrate into any interface of the redistribution circuit structure 220, thereby avoiding the interface delamination issue of the redistribution circuit structure 220. Accordingly, the reliability of the redistribution circuit structure 220 is enhanced. In addition, by separating the side surface S1 of the conductive pad P1 and the sidewall S2 of the opening O1 with the minimum distance d1 of about 3 µm to about 20 µm, and separating the side surface S3 of the conductive pad P3 and the sidewall S4 of the opening O2 with the minimum distance d2 of about 3 µm to about 100 µm as mentioned above, the interface delamination issue of the redistribution circuit structure 220 is eliminated while more flexibility is provided for the design of the layout of the topmost redistribution conductive layer 226. Furthermore, as mentioned above, the conductive balls 240 are directly placed on the conductive pads P1 of the topmost redistribution conductive layer 226, and the conductive terminals 252 are directly bonded to the conductive pads P3 of the topmost redistribution conductive layer 226, thereby in the integrated fan-out package InFO2, the connectors (e.g., the conductive balls 240 and the conductive terminals 252) are in contact with the connection pads (e.g., the conductive pads P1 and the conductive pads P3) without an UBM layer therebetween.

In accordance with some embodiments of the present disclosure, a semiconductor package including a semiconductor die, an encapsulant, an electrical connector, a conductive pad and an inter-dielectric layer is provided. The encapsulant encapsulates the semiconductor die. The electrical connector is disposed over the semiconductor die. The conductive pad contacts the electrical connector and is disposed between the semiconductor die and the electrical connector. The inter-dielectric layer is disposed over the semiconductor die, the inter-dielectric layer includes an opening, and a portion of the opening is occupied by the conductive pad and the electrical connector.

In accordance with alternative embodiments of the present disclosure, a semiconductor package including a semiconductor die, an encapsulant, inter-dielectric layers, a first conductive pad and a conductive ball is provided. The encapsulant encapsulates the semiconductor die. A first inter-dielectric layer among the inter-dielectric layers and a second inter-dielectric layer among the inter-dielectric layers are disposed over the semiconductor die, and the second inter-dielectric layer includes a first opening. The first conductive pad is disposed on a top surface of the first inter-dielectric layer and in the first opening. The conductive ball is disposed on and contacts the first conductive pad.

In accordance with yet alternative embodiments of the present disclosure, a semiconductor package including a semiconductor die, an encapsulant, a redistribution circuit structure and a conductive ball is provided. The encapsulant encapsulates the semiconductor die. The redistribution circuit structure is disposed on the encapsulant and the semiconductor die. The redistribution circuit structure includes inter-dielectric layers and redistribution conductive layers, and the inter-dielectric layers and the redistribution conductive layers are stacked alternately. A topmost redistribution conductive layer among the redistribution conductive layers is disposed on a middle inter-dielectric layer among the inter-dielectric layers, the topmost redistribution conductive layer includes a first conductive pad, a topmost inter-dielectric layer among the inter-dielectric layers is disposed on the topmost redistribution conductive layer, the topmost inter-dielectric layer includes a first opening, and the first conductive pad contacts the middle inter-dielectric layer and is disposed in the first opening. The conductive ball is disposed on the redistribution circuit structure, and the conductive ball contacts the first conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die;
   an encapsulant encapsulating the semiconductor die;
   an electrical connector disposed over the encapsulant;
   a redistribution conductive layer disposed over the semiconductor die and the encapsulant, wherein the redistribution conductive layer comprising a first conductive pad contacting the electrical connector and disposed between the encapsulant and the electrical connector;
   a second conductive pad contacting the redistribution conductive layer;
   a semiconductor component electrically connected to the second conductive pad, wherein the first conductive pad is located at lower height level than the second conductive pad,
   a first inter-dielectric layer disposed over the semiconductor die and the redistribution conductive layer, wherein the first inter-dielectric layer comprises an opening, and a portion of the opening is occupied by the first conductive pad and the electrical connector;
   a second inter-dielectric layer and a third inter-dielectric layer disposed over the semiconductor die and under the first inter-dielectric layer;
   a third conductive pad disposed on the second inter-dielectric layer and covered by the first inter-dielectric layer; and
   a bridge structure inlaid within the second inter-dielectric layer, disposed on the third inter-dielectric layer, and connecting the first conductive pad and the third conductive pad, wherein the bridge structure comprises a first conductive via, a routing line and a second conductive via, the first conductive via directly connects the first conductive pad and the routing line, the routing line directly connects the first conductive via and the second conductive via, the second conductive via directly connects the routing line and the third conductive pad, and a whole bottom surface of the routing line is in direct contact with a top surface of the third inter-dielectric layer, the first conductive pad is electrically connected to the semiconductor die, the routing line has a first side surface, a second side surface, a third side surface and a fourth side surface, the first side surface opposes to the second side surface, the third side surface opposes to the fourth side surface, and the first side surface, the second side surface, the third side surface and the fourth side surface of the routing line are directly surrounded by the second inter-dielectric layer.

2. The semiconductor package of claim 1, wherein a side surface of the first conductive pad is spaced apart form a sidewall of the opening.

3. The semiconductor package of claim 1, further comprising a conductive through via through the encapsulant and disposed around the semiconductor die, and the first conductive via of the bridge structure is overlapped with the conductive through via.

4. The semiconductor package of claim 1, wherein the semiconductor component is a passive component.

5. The semiconductor package of claim 1, wherein the first conductive pad is separated from the third conductive pad via the opening and the first inter-dielectric layer.

6. The semiconductor package of claim 1, wherein the third conductive pad is electrically connected to the semiconductor die, and the third conductive pad is located at lower height level than the second conductive pad.

7. A semiconductor package, comprising:
   a semiconductor die;
   an encapsulant encapsulating the semiconductor die;
   inter-dielectric layers, a first inter-dielectric layer among the inter-dielectric layers, a second inter-dielectric layer among the inter-dielectric layers and a third inter-dielectric layer among the inter-dielectric layers being disposed over the semiconductor die, wherein the second inter-dielectric layer comprises a first opening, and the first inter-dielectric layer is disposed between the second inter-dielectric layer and the third inter-dielectric layer;
   a first conductive pad disposed on a top surface of the first inter-dielectric layer and in the first opening;
   a conductive ball disposed on and contacting the first conductive pad;
   second conductive pads disposed on a top surface of the second inter-dielectric layer;
   a semiconductor component having conductive terminals, wherein the semiconductor component is mounted on the second conductive pads through the conductive terminals, and the first conductive pad and the second conductive pads are located at different height levels;
   a third conductive pad disposed on the first inter-dielectric layer and covered by the second inter-dielectric layer;
   a bridge structure inlaid within the first inter-dielectric layer, disposed on the third inter-dielectric layer, and connecting the first conductive pad and the third conductive pad, wherein the bridge structure comprises a first conductive via, a routing line and a second conductive via, the first conductive via directly connects the first conductive pad and the routing line, the routing line directly connects the first conductive via and the second conductive via, the second conductive via directly connects the routing line and the third conductive pad, and a whole bottom surface of the routing line is in direct contact with a top surface of the third inter-dielectric layer, and a whole side surface of the routing line is directly surrounded by the first inter-dielectric layer;
a fourth conductive pad disposed on the third inter-dielectric layer and spaced apart from the routing line by the first inter-dielectric layer; and
a third conductive via directly connecting the third conductive pad and the fourth conductive pad.

8. The semiconductor package of claim 7, wherein a minimum distance between a side surface of the first conductive pad and a sidewall of the first opening ranges from about 3 µm to about 20 µm.

9. The semiconductor package of claim 7, wherein the conductive ball is disposed right above the first conductive pad, and the first conductive pad is disposed right above the first conductive via.

10. The semiconductor package of claim 9, wherein an area ratio of the first conductive pad and the third conductive pad ranges from about 4 to about 625, and a length of the routing line ranges from about 50 µm to about 150 µm.

11. The semiconductor package of claim 7, wherein the third conductive pad is electrically connected to the semiconductor die, a whole top surface of the third conductive pad is covered by the second inter-dielectric layer, and a whole side surface of the third conductive pad is directly surrounded by the second inter-dielectric layer.

12. The semiconductor package of claim 7, wherein the semiconductor component is a passive component.

13. The semiconductor package of claim 7, further comprising:
an underfill layer between the passive component and the second inter-dielectric layer, wherein the underfill layer encapsulates the conductive terminals of the passive component.

14. A semiconductor package, comprising:
a semiconductor die;
an encapsulant encapsulating the semiconductor die;
a redistribution circuit structure disposed on the encapsulant and the semiconductor die, wherein the redistribution circuit structure comprises inter-dielectric layers and redistribution conductive layers, the inter-dielectric layers and the redistribution conductive layers are stacked alternately, a topmost redistribution conductive layer among the redistribution conductive layers is disposed on a first middle inter-dielectric layer among the inter-dielectric layers, the topmost redistribution conductive layer comprises a first conductive pad, second conductive pads, a third conductive pad, a first conductive via, a second conductive via and a third conductive via, a topmost inter-dielectric layer among the inter-dielectric layers is disposed on the topmost redistribution conductive layer, the topmost inter-dielectric layer comprises a first opening, the first conductive pad contacts the first middle inter-dielectric layer and is disposed in the first opening, and the second conductive pads contact the topmost inter-dielectric layer, a middle redistribution conductive layer among the redistribution conductive layers is disposed between the first middle inter-dielectric layer and a second middle inter-dielectric layer, the middle redistribution conductive layer comprises a routing line and a fourth conductive pad, wherein the first conductive via directly connects the first conductive pad and the routing line, the routing line directly connects the first conductive via and the second conductive via, the second conductive via directly connects the routing line and the third conductive pad, the fourth conductive pad is spaced apart from the routing line by the first middle inter-dielectric layer, the third conductive via directly connects the third conductive pad and the fourth conductive pad, and a whole bottom surface of the routing line is in direct contact with a top surface of the second middle inter-dielectric layer, and a whole side surface of the routing line is directly surrounded by the first middle inter-dielectric layer;
a conductive ball disposed on the redistribution circuit structure, wherein the conductive ball contacts the first conductive pad; and
a passive component having conductive terminals, wherein the conductive terminals of the passive component contact the second conductive pads.

15. The semiconductor package of claim 14, wherein
the conductive ball is disposed right above the first conductive pad, and the first conductive pad is disposed right above the first conductive via.

16. The semiconductor package of claim 15, wherein an area ratio of the first conductive pad and the third conductive pad ranges from about 4 to about 625, and a length of the routing line ranges from about 50 µm to about 150 µm.

17. The semiconductor package of claim 15, wherein the third conductive pad is electrically connected to the semiconductor die, a whole top surface of the third conductive pad is directly in contact with the topmost inter-dielectric layer, and a whole side surface of the third conductive pad is directly in contact with the topmost inter-dielectric layer.

18. The semiconductor package of claim 14, wherein a first portion of a top surface of the first middle inter-dielectric layer is uncovered by the topmost inter-dielectric layer and the topmost redistribution conductive layer, and the first portion of the top surface of the first middle inter-dielectric layer is in a ring top-view shape.

19. The semiconductor package of claim 14, further comprising:
an underfill layer between the passive component and the redistribution circuit structure, wherein the underfill layer encapsulates the conductive terminals of the passive component.

20. The semiconductor package of claim 18, wherein a width of the ring top-view shape ranges from about 3 µm to about 20 µm.

* * * * *